(12) United States Patent
Kon et al.

(10) Patent No.: US 6,844,135 B2
(45) Date of Patent: Jan. 18, 2005

(54) CHEMICALLY AMPLIFIED RESIST MATERIAL AND PATTERNING METHOD USING SAME

(75) Inventors: Junichi Kon, Kawasaki (JP); Koji Nozaki, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/614,236

(22) Filed: Jul. 8, 2003

(65) Prior Publication Data

US 2004/0013975 A1 Jan. 22, 2004

(30) Foreign Application Priority Data

Jul. 9, 2002 (JP) ........................................ 2002-200103

(51) Int. Cl.⁷ ............................ G03C 1/73; G03F 7/039
(52) U.S. Cl. .................... 430/270.1; 430/325; 430/326; 430/914; 430/916; 430/919; 430/920; 430/921; 430/327; 430/330; 430/913
(58) Field of Search .............................. 430/270.1, 325, 430/326, 914, 916, 919, 920, 921, 327, 330, 913

(56) References Cited

U.S. PATENT DOCUMENTS

| | | | | |
|---|---|---|---|---|
| 3,812,225 A | * | 5/1974 | Hosoda et al. ................ 264/54 |
| 4,220,342 A | * | 9/1980 | Shah ........................... 277/654 |
| 6,358,665 B1 | * | 3/2002 | Pawlowski et al. ...... 430/270.1 |
| 2002/0076643 A1 | | 6/2002 | Ohsawa et al. ........... 430/270.1 |
| 2002/0081504 A1 | * | 6/2002 | Kong et al. .................... 430/18 |
| 2003/0008240 A1 | | 1/2003 | Elian et al. .................. 430/296 |
| 2003/0022111 A1 | | 1/2003 | Falk et al. ................... 430/322 |
| 2003/0098464 A1 | * | 5/2003 | Kon et al. .................... 257/194 |

FOREIGN PATENT DOCUMENTS

| | | |
|---|---|---|
| DE | 101 20 661 A1 | 4/2001 |
| EP | 0 831 369 A2 | 3/1998 |
| EP | 0 985 974 A1 | 3/2000 |
| EP | 1 030 221 A1 | 8/2000 |
| EP | 1 045 290 A2 | 10/2000 |
| JP | 11-352702 | 12/1999 |
| WO | 01 42860 A | 6/2001 |

OTHER PUBLICATIONS

Copy of European Search Report dated Oct. 20, 2003.

* cited by examiner

*Primary Examiner*—Cynthia H. Kelly
*Assistant Examiner*—Sin J. Lee
(74) *Attorney, Agent, or Firm*—Westerman, Hattori, Daniels & Adrian, LLP

(57) ABSTRACT

A chemically amplified resist material comprising a base resin and a photo acid generator having sensitivity at the wavelength of patterning exposure; wherein, the chemically amplified resist material further comprising an activator that generates an acid or a radical by a treatment other than the patterning exposure. A patterning method using the same is also disclosed.

8 Claims, No Drawings

CHEMICALLY AMPLIFIED RESIST MATERIAL AND PATTERNING METHOD USING SAME

CROSS-REFERENCES TO RELATED APPLICATIONS

This application is based upon and claims the benefit of priority from prior Japanese Patent Application No. 2002-200103, filed on Jul. 9, 2002, the entire contents thereof being incorporated herein by reference.

BACKGROUND OF THE INVENTION

1. Field of the Invention

The present invention relates to a chemically amplified resist material and a patterning method that uses the same. More particularly, the present invention relates to a chemically amplified resist material useful for forming patterns for microfabrication in the production of semiconductor devices and magnetic heads, and a patterning method that uses the chemically amplified resist material.

2. Description of the Related Art

In recent years, chemically amplified resists containing photo acid generators have been widely used for microfabrication of semiconductor devices (see, for example, J. M. J. Frechet, et al., Proc. Microcircuit Eng., 260 (1982); H. Ito, et al., "Polymers in Electronics", ACS Symposium Series 242, T. Davidson., ed., ACS, 11 (1984); and, U.S. Pat. No. 4,491,628 (1985)). Chemically amplified resists generate acids from photo acid generators by being irradiated with ultraviolet rays, electron beam, X-rays or convergent ion beam, and this acid functions as a catalyst during post exposure bake, with the resulting catalytic reaction changing the exposed portion into alkaline-soluble (in the case of a positive resist) or alkaline-insoluble (in the case of a negative resist). Consequently, the use of a chemically amplified resist makes it possible to improve exposure sensitivity.

As chemically amplified resists use a catalytic reaction driven by an extremely small amount of acid, they are susceptible to the effects of external impurities. If the impurities are basic species in particular, they are known to cause deactivation of the acid that leads to deterioration of the form of the pattern formed by exposure and development. Those locations at which deterioration of the pattern form occurs are in close proximity to the interface between the upper and lower portions of the formed pattern (surface layer and bottom of the resist film), and this deterioration is mainly caused by basic species present in the atmosphere and on the substrate surface, respectively.

With respect to the effect of basic species present in the atmosphere, since basic species adsorbed onto the surface layer of the resist film and basic species diffused in the resist film from the surface layer neutralize an acid generated from the photo acid generator by exposure, solubilization (in the case of a positive resist) or insolubilization (in the case of a negative resist) of the resist material near the surface layer of the resist film of the exposed portion is impaired. As a result, the pattern of a positive resist takes on the shape of a T-top (formation of a poorly dissolving surface layer), while the pattern of a negative resist takes on the shape of a round top (missing upper portion of the pattern).

On the other hand, with respect to the effects of basic species from the substrate, since basic species present on the substrate surface and basic species diffused in the resist from the substrate surface neutralize the acid generated by exposure, solubilization (in the case of a positive resist) or insolubilization (in the case of a negative resist) of the resist material near the interface with the substrate is impaired. As a result, the pattern of a positive resist takes on the form of a footing, while the pattern of a negative resist takes on the form of an undercut. The effects of basic species from the undercoating in this manner are even more remarkable in cases in which a film containing basic species such as SiN, SiON, TiN, BPSG, BSG or PSG is formed on the substrate surface. In addition, footings and undercuts similarly occur due to diffusion of acid generated in the resist into an underlying film.

The occurrence of pattern defects such as the T-top, round top, footing or undercut as described above prevents the underlying film from being processed to the predetermined dimensions, thereby making microfabrication of semiconductor devices difficult.

Although the effects of basic species in the atmosphere can be suppressed to a certain extent by controlling the process atmosphere by, for example, using a basic species adsorbing filter, this results in the problem of excessive complexity of the production equipment.

On the other hand, the formation of a protective film comprised of a thermosetting resin and so forth between the substrate and resist film had been proposed as a method for avoiding the effects of basic species from the substrate. However, the protective film must be coated to an adequate thickness by a method such as spin coating or CVD and so forth in order to suppress diffusion of the basic species. In addition, there are cases when the removal of this protective film following patterning of the resist film requires an etching agent that differs from the developing solution of the resist, thereby resulting in the problem of causing the process to become excessively complex.

SUMMARY OF THE INVENTION

An object of the present invention is to provide a chemically amplified resist material, which is able to suppress pattern defects in a chemically amplified resist film caused by external basic species without increasing the complexity of the production equipment and process, and a patterning method that uses this chemically amplified resist material.

The chemically amplified resist material according to the present invention is a resist material comprising a base resin and a photo acid generator having sensitivity at the wavelength of patterning exposure; the chemically amplified resist material further comprising an activator that generates an acid or a radical by a treatment other than the patterning exposure.

The patterning method according to the present invention is a patterning method in which a resist pattern is transferred to an underlying film or layer by photolithography followed by patterning of the film or layer, and comprises the formation of the resist pattern by a step in which a resist film is formed from the chemically amplified resist material of the present invention on a substrate provided with the film or layer to be patterned on its surface, a step in which treatment is performed in which an acid or a radical is generated from an activator in the resist film, a step in which the resist film is exposed in a predetermined pattern, and a step in which the exposed resist film is baked and developed to form a resist pattern.

DETAILED DESCRIPTION OF THE INVENTION

The present invention provides a chemically amplified resist material that is able to suppress pattern defects of a resist film caused by external basic species. This chemically amplified resist material contains a base resin and a photo acid generator having sensitivity at the wavelength of patterning exposure that generates, as a result of exposure, an acid which functions as a catalyst during subsequent baking, and as a result of alkaline solubilization (in the case of a positive resist) or alkaline insolubilization (in the case of a negative resist) of the exposed portion due to the catalytic action of the acid, a resist pattern can be formed by an alkaline developing solution, with the chemically amplified resist material also containing, in addition to the base resin and photo acid generator, an activator that generates an acid or a radical by a separate treatment from patterning exposure.

The base resin in the chemically amplified resist material of the present invention may be any base resin used in an ordinary chemically amplified resist material. In the case of the resist material of a negative resist, the base resin contains a crosslinking agent or curing agent for making the base resin insoluble in the alkaline developing solution by reacting with it.

The photo acid generator contained in the chemically amplified resist material of the present invention is a substance that is directly involved in patterning by this resist material, and generates an acid as a result of patterning exposure. Various types of compounds known in the field of chemically amplified resist materials can be used for the photo acid generator in the resist material of the present invention. Examples of such photo acid generators include onium salt compounds, organic halogen compounds sulfone compounds and sulfonate compounds, and any of these can be used in the chemically amplified resist material of the present invention.

The activator used in the chemically amplified resist material of the present invention is a substance that generates an acid or a radical by a treatment that is different than the patterning exposure that generates an acid from a photo acid generator. This activator generates an acid or a radical by a treatment in a step prior to patterning exposure, and suppresses pattern defects in the resist film that occur when basic species are present during patterning exposure by neutralizing external basic species present in the resist film, and particularly near the surface layer portion of the film and near the interface between the film and an underlying film, prior to patterning exposure (prior to generation of acid required for patterning of the resist film from the photo acid generator).

The activator used in the present invention generates an acid or a radical used for neutralization of basic species present in the resist film by decomposition. In order to decompose an activator in the resist film, the resist film is subjected to, prior to patterning exposure, a treatment separate from the patterning exposure.

In order to decompose the activator and generate an acid or a radical, it is preferable to use a thermal acid generator or thermal radical generator as an activator. Examples of thermal acid generators include aliphatic sulfonic acids, aliphatic sulfonates, aliphatic carboxylic acids, aliphatic carboxylates, aromatic sulfonic acids, aromatic sulfonates, aromatic carboxylic acids, aromatic carboxylates, metal salts, phosphate esters and acid-breeding agents as described in Japanese Unexamined Patent Publication No. 8-248561 that are thermally unstable and decompose at comparatively low temperatures. Examples of thermal radical generators include various compounds known to be initiators of radical reactions, such as peroxides and azo compounds.

Thermal acid generators and thermal radical generators are required to be used for neutralization of basic species within the resist film by decomposing prior to patterning exposure. Preferably, thermal acid generators and thermal radical generators are decomposed during formation and baking of the resist film after coating the resist material onto a substrate. Thus, the decomposition temperature of the thermal acid generator or thermal radical generator is preferably equal to or below the baking temperature during formation of the resist film. In consideration of the decomposition temperature of the photo acid generator used for patterning the resist film and the softening temperature of typical base resins, the baking temperature during formation of the resist film is preferably within the range of 90–200° C. and, accordingly, a substance that decomposes at about 70–180° C. is preferably selected for the thermal acid generator or thermal radical generator.

Substances that generate an acid or a radical when irradiated by rays (namely, photo acid generators or photo radical generators) can also be used as an activator. In this case, the resist film is exposed to rays at a wavelength to which the photo acid generator used for patterning the resist film does not have sensitivity, and as a result, the activator decomposes to generate an acid or a radical. In order to accomplish this, a step is required in which the entire surface of the resist film is irradiated with radiation at a wavelength that differs from that for the patterning exposure prior to the patterning exposure to decompose the activator. In addition, after irradiating the entire surface, a baking step may be added to promote neutralization of basic species near the surface layer of the resist film and near the interface with the underlying substrate by the generated acid.

The radiation to generate an acid or a radical by decomposing a photo acid generator or photo radical generator is preferably visible rays, ultraviolet rays, an electron beam, X-ray or a convergent ion beam. In addition, in consideration of the resolution performance of the resist material, the absorbance of the resist film at the wavelength of the radiation is preferably 1.75 or less.

It is preferable that the number of molecules of acid or radical generated by decomposition of the activator be no more than one-fifth the number of molecules of acid generated by decomposition of the photo acid generator due to subsequent patterning exposure. If the number of molecules of acid or radical generated by decomposition of the activator is more than one-fifth the number of molecules of acid generated from the photo acid generator due to patterning exposure, a reaction with the base resin may occur that is equivalent to that when ordinary patterning exposure is performed (resulting in the generation of acid by decomposition of the photo acid generator) at the stage of neutralization of basic species, namely at the stage prior to patterning exposure, thereby preventing the desired patterning for solubilization of the entire surface of the resist film in the case of a positive resist material, or insolubilization of the entire surface of the resist film in the case of a negative resist material.

Thus, an activator is added to the resist material in an amount such that the number of molecules of acid or radical generated by its decomposition is no more than one-fifth the number of molecules of acid generated from the photo acid generator due to subsequent patterning exposure. However, even though this is the case, as the number of molecules of acid or radical generated by decomposition of the activator fluctuates depending on the treatment conditions for decomposition of the activator (e.g., heating temperature and heating time in the case of an activator decomposed by heat, or wavelength of the radiated rays and exposure time in the case of an activator decomposed by rays), the amount of activator actually used must be determined in consideration of the type and decomposition treatment conditions of activator, as well as the resist system to which the activator is added (the number of molecules of acid generated from the photo acid generator varies for each resist system), and that amount can be easily determined by simple experimentation.

The chemically amplified resist material of the present invention can be easily prepared by adding an activator to an existing chemical resist material in an amount such that the number of molecules of an acid or a radical generated by decomposition thereof is no more than one-fifth the number of molecules of acid generated from the photo acid generator due to subsequent patterning exposure. Even in the case of designing a new chemically amplified resist material, the blending of base resin and photo acid generator may be similarly determined followed by addition of activator.

In the case of patterning an underlying film or layer with the chemically amplified resist material of the present invention, a resist film comprised of a chemically amplified resist material can be formed on an underlying film or layer, an acid or a radical is generated from the activator in the resist film by heating or by irradiating with rays at a wavelength effective for decomposing the activator, the resist film is exposed in a predetermined pattern, a resist pattern is formed by baking and developing, and then the underlying film or layer can be patterned by photolithography using the resist pattern as a mask.

Although the chemically amplified resist and pattering method using that resist of the present invention are naturally effective in suppressing pattern defects in the surface layer portion of the resist pattern caused by basic species from the atmosphere, they are also extremely effective in suppressing pattern defects near the interface between the resist film and the underlying film or layer caused by basic species contained by the underlying film or layer to which the resist pattern is to be transferred. Examples of underlying films or layers that contain basic species include films or layers formed from SiN, SiON, TiN, BPSG, BSG or PSG.

EXAMPLES

Although the following provides a more detailed explanation of the present invention through its examples, the present invention is not limited to these examples.

The term "parts" used in the following examples refers to "parts by weight" unless specified otherwise.

The following substances were made available for use as constituent substances of a resist material.

1. Base Resins
    1-1 Polyvinylphenol/t-butylacryalte (50/50) copolymer
    1-2 Polyvinylphenol
2. Crosslinking Agent
    2-1 Hexamethoxymethyl melamine
3. Photo acid generators
    3-1 Triphenylsulfonium triflate
    3-2 Diphenyliodonium triflate
    3-3 Compound represented with the following formula (I):

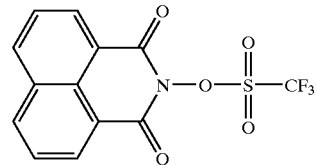

4. Thermal acid generators
    4-1 2-nitrobenzyl tosylate
    4-2 N-(10-camphorsulfonyloxy)succinimide
5. Thermal radical generator
    5-1 Dimethyl-2,2'-azo-bis-isobutyrate
6. Solvent
    6-1 Propylene glycol monomethyl ether acetate

Example 1

The following substances were mixed to prepare coating liquids 1-3 having different thermal acid generators.
Base resin: 1-1 (100 parts)
Thermal acid generators:
    None—Coating liquid 1 (comparative example)
    4-1 (5 parts)—Coating liquid 2
    4-2 (5 parts)—Coating liquid 3
Solvent: 6-1 (500 parts)
The following process was carried out using the above coating liquids.
(1) Coating liquid was spin coated onto an Si substrate followed by baking for 60 seconds at 80–130° C.
(2) Dissolving speed of the coated film was measured using a 4% aqueous tetramethylammonium hydroxide solution.

The relationship between film formation temperature and the dissolving speed of the film is shown in Table 1.

TABLE 1

| Formation temperature (° C.) | Dissolving speed (nm/sec) | | |
| --- | --- | --- | --- |
| | Coating liquid 1 | Coating liquid 2 | Coating liquid 3 |
| 80 | 0.04 | 0.02 | 0.02 |
| 90 | 0.04 | 0.02 | 0.15 |
| 100 | 0.03 | 0.2 | 7.5 |
| 110 | 0.03 | 15 | >$10^3$ |
| 120 | 0.03 | >$10^3$ | >$10^3$ |
| 130 | 0.03 | >$10^3$ | >$10^3$ |

Based on the solubilization of the base resin, the decomposition temperatures of thermal acid generators 4-1 and 4-2 were judged to be 120° C. and 110° C., respectively.

Example 2

The following substances were mixed to prepare positive resists 4 through 8 having different added amounts of thermal acid generator 4-1. The amounts of thermal acid generator 4-1 added to positive resists 4 through 8 were 0, 10, 20, 30 and 40 mol %, respectively, with respect to the amount of photo acid generator 3-1.
Base resin: 1-1 (100 parts)
Photo acid generator: 3-1 (5 parts)
Thermal acid generator: 4-1
Solvent: 6-1 (500 parts)
The following process was carried out using the above resists.

(1) The positive resist was spin coated onto an Si substrate on which was formed an SiN film at a thickness of 100 nm followed by baking for 60 seconds at 120° C. to form a resist film.

(2) The resist film was exposed in a line and space pattern having a width of 0.2 $\mu$m and pitch of 0.4 $\mu$m using a KrF excimer laser (wavelength=254 nm) exposing apparatus (exposure dose: 20 mJcm$^{-2}$).

(3) Following exposure, the resist film was baked for 60 seconds at 110° C. (post-exposure baking (PEB)).

(4) The resist film was then developed for 60 seconds with 2.38% aqueous tetramethylammonium hydroxide solution.

As a result, although the formation of a T-top and footing occurred in Resist 4 (Comparative Example) thereby preventing resolution of the pattern, the resist pattern was resolved directly from the upper surface to the substrate in resists 5 and 6. In resists 7 and 8, the entire surface of the resist was solubilized thereby preventing pattern formation.

Example 3

The following substances were mixed to prepare positive resists 9 through 13 having different added amounts of thermal acid generator 4-2. The amounts of thermal acid generator 4-2 in positive resists 9 through 13 were 0, 10, 20, 30 and 40 mol %, respectively, with respect to the amount of photo acid generator 3-2.

Base resin: 1-1 (100 parts)

Photo acid generator: 3-2 (5 parts)

Thermal acid generator: 4-2

Solvent: 6-1 (500 parts)

The following process was carried out using the above resists.

(1) The positive resist was spin coated onto an Si substrate on which was formed an SiO$_2$ film at a thickness of 50 nm followed by baking for 60 seconds at 110° C. to form a resist film.

(2) The resist film was exposed in a line and space pattern having a width of 0.15 $\mu$m and pitch of 0.3 $\mu$m using an electron beam exposing apparatus having an acceleration voltage of 50 keV (exposure dose: 10 $\mu$Ccm$^{-2}$).

(3) Following exposure, the resist film was baked for 60 seconds at 100° C. (post-exposure baking (PEB)).

(4) The resist film was then developed for 60 seconds with 2.38% aqueous tetramethylammonium hydroxide solution.

As a result, although footing occurred in Resist 9 (Comparative Example) thereby preventing resolution of the pattern, the resist pattern was resolved directly from the upper surface to the substrate in resists 10, 11 and 12. In resist 13, the entire surface of the resist was solubilized thereby preventing pattern formation.

Example 4

The following substances were mixed to prepare positive resists 14 and 15.

Base resin: 1-1 (100 parts)

Photo acid generator: 3-1 (5 parts)

Radical generator: None—Resist 14
  5-1 (0.5 parts)—Resist 15

Solvent: 6-1 (500 parts)

The following process was carried out using the above resists.

(1) The positive resist was spin coated onto an Si substrate on which was formed a BPSG film at a thickness of 500 nm followed by baking for 60 seconds at 110° C. to form a resist film.

(2) The resist film was exposed in a line and space pattern having a width of 0.2 $\mu$m and pitch of 0.4 $\mu$m using a KrF excimer laser (wavelength=254 nm) exposing apparatus (exposure dose: 20 mJcm$^{-2}$).

(3) Following exposure, the resist film was baked for 60 seconds at 100° C. (post-exposure baking (PEB)).

(4) The resist film was then developed for 60 seconds with 2.38% aqueous tetramethylammonium hydroxide solution.

As a result, although the formation of a T-top and footing occurred in Resist 14 (Comparative Example) thereby preventing resolution of the pattern, T-top and footing were improved in Resist 15 and the pattern was able to be resolved.

Example 5

The following substances were mixed to prepare negative resists 16 and 17.

Base resin: 1-2 (100 parts)

Crosslinking agent: 2-1 (10 parts)

Photo acid generator: 3-1 (5 parts)

Thermal acid generator: None—Resist 16 4-1 (10 mol % with respect to photo acid generator 3-1)—Resist 17

Solvent: 6-1 (500 parts)

The following process was carried out using the above resists.

(1) The negative resist was spin coated onto an Si substrate on which was formed a TiN film at a thickness of 80 nm followed by baking for 60 seconds at 120° C. to form a resist film.

(2) The resist film was exposed in a line and space pattern having a width of 0.15 $\mu$m and pitch of 0.3 $\mu$m using an electron beam exposing apparatus having an acceleration voltage of 50 keV (exposure dose: 15 $\mu$Ccm$^{-2}$).

(3) Following exposure, the resist film was baked for 60 seconds at 110° C. (post-exposure baking (PEB)).

(4) The resist film was then developed for 60 seconds with 2.38% aqueous tetramethylammonium hydroxide solution.

As a result, although the pattern was disturbed due to the occurrence of undercutting in Resist 16 (Comparative Example), the resist pattern was resolved directly from the upper surface to the substrate in Resist 17, and a pattern was able to be formed.

Example 6

The following substances were mixed to prepare positive resist 18.

Base resin: 1-1 (100 parts)

Photo acid generator (1): 3-1 (5 parts)

Photo acid generator (2): 3-3 (0.5 parts)

Solvent: 6-1 (500 parts)

Among the photo acid generators used in this example, photo acid generator 3-1 is not sensitive to ultraviolet rays at a wavelength of 300 nm or longer.

The following process was carried out using the above resist.

(1) The positive resist was spin coated onto an Si substrate on which was formed an SiN film at a thickness of 100 nm followed by baking for 60 seconds at 110° C. to form a resist film.

(2) The entire surface of the resist film was exposed for 1 minute with a g-line lamp (wavelength=365 nm) (exposure dose: 100 mJcm$^2$).

(3) The resist film was baked for 60 seconds at 110° C.

(4) The resist film was exposed in a line and space pattern having a width of 0.2 $\mu$m and pitch of 0.4 $\mu$m using a KrF excimer laser (wavelength=254 nm) exposing apparatus (exposure dose: 20 mJcm$^{-2}$).

(5) Following exposure, the resist film was baked for 60 seconds at 100° C. (post-exposure baking (PEB)).

(6) The resist film was then developed for 60 seconds with 2.38% aqueous tetramethylammonium hydroxide solution.

As a result, although the formation of a T-top and footing occurred that prevented resolution of the pattern when steps (2) and (3) of the above process were not carried out (Comparative Example), when the entire process was carried out, the resist pattern was resolved directly from the upper surface to the substrate.

As has been explained above, according to the present invention, a fine resist pattern can be formed while suppressing pattern defects of a chemically amplified resist film caused by basic species from the outside, and an underlying film or layer on which microfabrication is to be performed can be patterned to predetermined dimensions using this resist pattern. The present invention is particularly effective in the case the underlying film or layer to which a resist pattern is to be transferred contains basic species that cause pattern defects in a chemically amplified resist film.

What is claimed is:

1. A chemically amplified resist material comprising a base resin and a photo acid generator having sensitivity at the wavelength of patterning exposure, wherein the chemically amplified resist material further comprises an activator that generates an acid or a radical by a treatment other than the patterning exposure;

wherein the activator generates an acid or a radical as a result of being decomposed by heating at a temperature equal to or below the baking temperature at which a resist film is formed from a coated film of the resist material.

2. The chemically amplified resist material according to claim 1, wherein the temperature at which the activator decomposes is 70–180° C.

3. The chemically amplified resist material according to claim 1, wherein the activator is at least one type of thermal acid generator selected from the group consisting of aliphatic sulfonic acids, aliphatic sulfonates, aliphatic carboxylic acids, aliphatic carboxylates, aromatic sulfonic acids, aromatic sulfonates, aromatic carboxylic acids, aromatic carboxylates, metal salts, phosphate esters and acid-breeding agents.

4. The chemically amplified resist material according to claim 1, wherein the activator is at least one type of radical generator selected from the group consisting of peroxides and azo compounds.

5. The chemically amplified resist material according to claim 1, wherein the activator generates an acid or a radical by exposure at a wavelength at which the photo acid generator is not sensitive.

6. The chemically amplified resist material according to claim 1, wherein the number of molecules of acid or radical generated as a result of decomposition of the activator is no more than one-fifth the number of molecules of acid generated as a result of decomposition of the photo acid generator.

7. The chemically amplified resist material according to claim 1, which is used for patterning a film or layer formed from a material containing basic species.

8. The chemically amplified resist material according to claim 7, wherein the material containing basic species is SiN, SiON, TiN, BPSG, BSG or PSG.

* * * * *